United States Patent
Xian et al.

(10) Patent No.: US 10,403,647 B2
(45) Date of Patent: Sep. 3, 2019

(54) ARRAY SUBSTRATE AND DISPLAY DEVICE

(71) Applicant: BOE TECHNOLOGY GROUP CO., LTD., Beijing (CN)

(72) Inventors: Jianbo Xian, Beijing (CN); Pan Li, Beijing (CN); Xinyin Wu, Beijing (CN); Yong Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/550,473

(22) PCT Filed: Apr. 19, 2017

(86) PCT No.: PCT/CN2017/081079
§ 371 (c)(1),
(2) Date: Aug. 11, 2017

(87) PCT Pub. No.: WO2018/040584
PCT Pub. Date: Mar. 8, 2018

(65) Prior Publication Data
US 2018/0240816 A1    Aug. 23, 2018

(30) Foreign Application Priority Data
Aug. 31, 2016   (CN) ..................... 2016 2 1035396 U

(51) Int. Cl.
*H01L 29/80*    (2006.01)
*H01L 27/12*    (2006.01)
(Continued)

(52) U.S. Cl.
CPC ........ *H01L 27/124* (2013.01); *G02F 1/13458* (2013.01); *H01L 23/3157* (2013.01)

(58) Field of Classification Search
CPC ............ G02F 1/136286; G02F 1/1368; G02F 2201/121; G02F 1/133512;
(Continued)

(56) References Cited

U.S. PATENT DOCUMENTS 5,757,450 A    5/1998 Fujii et al.
7,267,555 B2   9/2007 Huagn et al.
(Continued)

FOREIGN PATENT DOCUMENTS

CN    1467552 A    1/2004
CN    1928676 A    3/2007
(Continued)

OTHER PUBLICATIONS

International Search Report of PCT/CN2017/081079 in Chinese, dated May 27, 2017 with English translation.
(Continued)

*Primary Examiner* — Robert G Bachner
(74) *Attorney, Agent, or Firm* — Collard & Roe, P.C.

(57) ABSTRACT

An array substrate and a display device are provided. The array substrate includes: a base substrate; and first leads, third leads, and second leads connecting the first leads and the third leads on the base substrate. The base substrate includes a second region corresponding to a sealing material, a sealed first region, and a third region provided on a side of the second region away from the first region. The first region includes the first leads; the second region includes the second leads; and the third region includes the third leads. The area ratio of two adjacent third leads is greater than that of corresponding two adjacent first leads.

19 Claims, 3 Drawing Sheets

(51) Int. Cl.
H01L 23/31 (2006.01)
G02F 1/1345 (2006.01)

(58) Field of Classification Search
CPC ......... G02F 1/133514; G02F 1/134309; G02F 2201/123; G02F 1/133305; G02F 1/133308; G02F 1/13338; G02F 1/133528; G02F 1/133553; G02F 1/1343; G02F 1/13452; G02F 1/136213; G02F 2201/56; G02F 1/1333; G02F 1/133345; G02F 1/133606; G02F 1/1362; G02F 2001/13398; G02F 2202/16; G02F 1/13; G02F 1/1303; G02F 1/1309; G02F 1/13306; G02F 1/1335; G02F 1/133504; G02F 1/133555; G02F 1/133602; G02F 1/133611; G02F 1/13363; G02F 1/133723; G02F 1/133788; G02F 1/1339; G02F 1/13392; G02F 1/13394; G02F 1/134336; G02F 1/134363; G02F 1/13454; G02F 1/13458; G02F 1/136209; G02F 1/29; G02F 2001/133354; G02F 2001/133397; G02F 2001/133531; G02F 2001/133607; G02F 2001/133638; G02F 2001/133796; G02F 2001/134318; G02F 2001/134345; G02F 2001/134372; G02F 2001/13629; G02F 2201/30; G02F 2201/44; G02F 2201/50; G02F 2201/52; G02F 2202/022; G02F 2202/28; H01L 51/56; H01L 27/124; H01L 27/1225; H01L 27/3246; H01L 27/127
See application file for complete search history.

(56) References Cited

U.S. PATENT DOCUMENTS

| 2003/0231276 | A1 | 12/2003 | Miki et al. | |
| 2006/0103802 | A1* | 5/2006 | Miki | G02F 1/1339 349/153 |
| 2012/0105392 | A1* | 5/2012 | Nagami | G02F 1/1345 345/204 |
| 2018/0188615 | A1* | 7/2018 | Li | G02F 1/1343 |

FOREIGN PATENT DOCUMENTS

| CN | 105652498 A | 6/2016 |
| CN | 206020893 U | 3/2017 |

OTHER PUBLICATIONS

Notice of Transmittal of the International Search Report of PCT/CN2017/081079 in Chinese, dated May 27, 2017 with.
Written Opinion of the International Searching Authority of PCT/CN2017/081079 in Chinese, dated May 27, 2017 with English translation of relevant parts.

* cited by examiner

ARRAY SUBSTRATE AND DISPLAY DEVICE

CROSS REFERENCE TO RELATED APPLICATIONS

This application is the National Stage of PCT/CN2017/081079 filed on Apr. 19, 2017, which claims priority under 35 U.S.C. § 119 of Chinese Application No. 201621035396.4 filed on Aug. 31, 2016, the disclosure of which is incorporated by reference.

TECHNICAL FIELD

Embodiments of the present invention relate to an array substrate and a display device.

BACKGROUND

Display devices have a very broad application prospect in fields, such as mobile phones, personal digital assistants (PDAs), digital cameras, vehicle displays, notebook computers, wall hung TVs, and military field.

A display device generally adopts sealant to seal photoelectric materials (e.g., liquid crystals) between substrates, and signal lines within the inside of the sealant are led out through lead-out wires and connected with a drive circuit. The inclining angle of the lead-out wires, the spacing between adjacent lead-out wires, the line width of the lead-out wires and the like shall be considered. For instance, if the spacing between the adjacent lead-out wires is too small and the line width of the lead-out wires is too narrow, the lead-out wires tend to be corroded due to the existence of solid impurities in the narrow wires, which introduce defects, such as an interruption of an electric signal. The lead-out wires have higher probability to contact solid impurities, oxygen, water and the like, particularly in regions outside the sealant, so that the lead-out wires outside the sealant can be more easily corroded. If the line width of the lead-out wires is too large, the size of the display device will be inevitably increased, so that a light and thin design of product cannot be achieved.

SUMMARY

At least one embodiment of the present disclosure provides an array substrate. The array substrate comprises a base substrate; and first leads, third leads, and second leads connecting the first leads and the third leads on the base substrate. The base substrate includes a second region corresponding to a sealing material, a sealed first region, and a third region on a side of the second region away from the first region. The first region includes the first leads; the second region includes the second leads; and the third region includes the third leads. An area ratio of at least part of two adjacent third leads is greater than that of corresponding two adjacent first leads.

For example, in an array substrate provided in at least one embodiment of the present invention, each of the third leads has a width greater than that of each of the first leads corresponding to the third leads.

For example, in an array substrate provided in at least one embodiment of the present invention, further comprising signal lines connected with the first leads. An acute angle formed between the first leads and an arrangement direction of the signal lines is set to be a first angle; an acute angle formed between the third leads and the arrangement direction of the signal lines is set to be a third angle; and the third angle is greater than the first angle corresponding to the third angle.

For example, in an array substrate provided in at least one embodiment of the present invention, each of the second leads has a width greater than that of each of the third leads corresponding to the second leads.

For example, in an array substrate provided in at least one embodiment of the present invention, an acute angle or a right angle formed between the second leads and the arrangement direction of the signal lines is set to be a second angle; and the second angle is greater than the first angle.

For example, in an array substrate provided in at least one embodiment of the present invention, the second angle is 80-90 degrees.

For example, in an array substrate provided in at least one embodiment of the present invention, the second region comprises a fourth sub-region; the fourth sub-region being adjacent to the first region; and second sub-leads being disposed in the fourth sub-region.

For example, in an array substrate provided in at least one embodiment of the present invention, each of the second sub-leads has a width greater than or equal to that of each of the first leads.

For example, in an array substrate provided in at least one embodiment of the present invention, the second sub-lead at least comprises partial bending structure.

For example, in an array substrate provided in at least one embodiment of the present invention, a distance between connecting points of two adjacent first leads and the signal lines corresponding to the two adjacent first leads is equal to a distance between connecting points of two adjacent third leads and second leads corresponding to the two adjacent first leads.

For example, in an array substrate provided in at least one embodiment of the present invention, further comprising through hole structures configured to connect the second leads and corresponding first leads, the through hole structures being provided in the first region.

For example, in an array substrate provided in at least one embodiment of the present invention, each of the first leads has a thickness less than that of corresponding third lead.

For example, in an array substrate provided in at least one embodiment of the present invention, each of the third leads comprises multiple conductive layers; and a number of conductive layers of the third leads is greater than that of conductive layers of corresponding first leads.

For example, in an array substrate provided in at least one embodiment of the present invention, each of the third leads further comprises a corrosion-resistant layer.

For example, in an array substrate provided in at least one embodiment of the present invention, each of the first leads and the second leads comprises a corrosion-resistant layer; and the corrosion resistance of the corrosion-resistant layer of each of the third leads is stronger than that of the corrosion-resistant layer of each of the first leads and the second leads.

At least one embodiment of the present invention also provides a display device, comprising any of the array substrates.

BRIEF DESCRIPTION OF THE DRAWINGS

In order to demonstrate clearly technical solutions of the embodiments of the present invention, the accompanying drawings in relevant embodiments of the present invention will be introduced briefly. It is apparent that the drawings may only relate to some embodiments of the present invention and not intended to limit the present invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the disclosure. It is apparent that the described embodiments are just a part but not all of the embodiments of the invention. Based on the described embodiments herein, those skilled in the art can obtain other embodiment(s), without any creative work, which shall be within the scope of the invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present invention, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
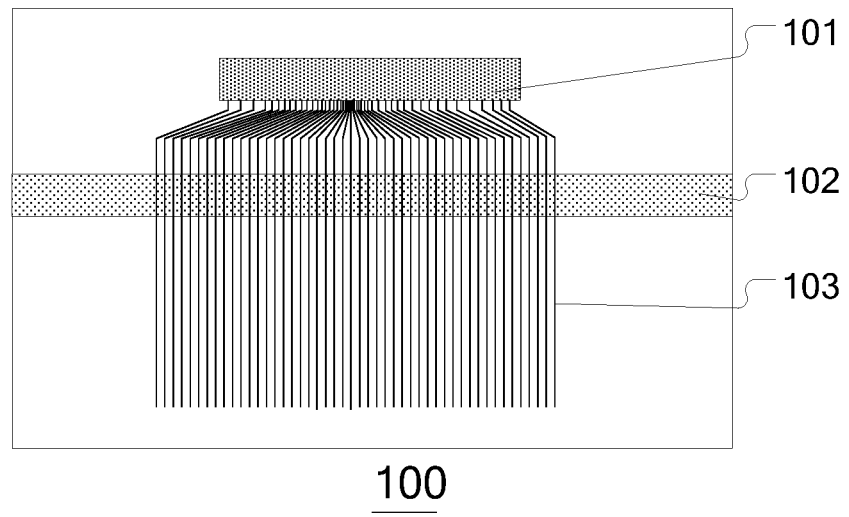
FIG. 1 is a schematic structural view of part of an array substrate.

Generally, signal lines on an array substrate will be led out through lead-out wires and hence can be electrically connected with a drive circuit. For instance, FIG. 1 is a schematic structural view of part of an array substrate, and a sealing material (e.g., sealant) 102 may be coated on the array substrate, so that the array substrate and an opposed substrate (not shown) can be bonded to each other. Description will be given below by taking the case that the sealing material is the sealant as an example. As shown in FIG. 1, in the array substrate 100, a plurality of lead-out wires 103 are uniformly distributed on the outside and the inside of the sealant 102 in parallel, namely running through regions coated with the sealant 102, and lead-out wires close to a signal driver are close to each other at a specific inclining angle. It should be noted that the side of the sealant close to the signal driver 101 is the outside of the sealant 102, and the side away from the signal driver is the inside of the sealant 102. The signal driver includes a gate driver, a source driver, etc. For instance, the source driver includes a source driver chip.

The inventors of the present invention have noticed that: in the array substrate, as the extent of corrosion of oxygen, water, solid impurities, or the like on the lead-out wires on the outside and the inside of the sealant 102 is different, if the lead-out wires have consistent thickness on the outside and the inside of the sealant 102 and the inclining angles are the same, the lead-out wires on the outside of the sealant 102 are more easily corroded to result in a poor transmission of electric signals. On the other hand, if the inclining angle of the lead-out wires is too large, a larger layout space of lead-out wire is required, and the required signal driver connected with the lead-out wires will also be designed to be large, so the light and thin design of the product cannot be achieved.

The inventors of the present invention propose a layout design of lead-out wires of an array substrate. The area ratio of two adjacent third leads is designed to be greater than the area ratio of corresponding two adjacent first leads, to reduce the corrosion on the lead-out wires of the array substrate, and to reduce defect of the poor electric signal transmission caused by corrosion. Meanwhile, the layout space of the lead-out wires is saved, which is more favorable for the light and thin design of the array substrate.

At least one embodiment of the present invention provides an array substrate, which comprises: a base substrate; and first leads, third leads and second leads connecting the first leads and the third leads on the base substrate. The base substrate includes a second region corresponding to a sealing material, a sealed first region, and a third region disposed on a side of the second region away from the first region. The first region includes the first leads; the second region includes the second leads; and the third region includes the third leads. The area ratio of at least parts of two adjacent third leads is greater than the area ratio of corresponding two adjacent first leads.

It should be noted that: in a plane parallel to the base substrate, if the occupied area of two adjacent leads is set to be a, and the area of the spaced region of the two adjacent leads is b, the area ratio is a/(a+b).

Figure 2:
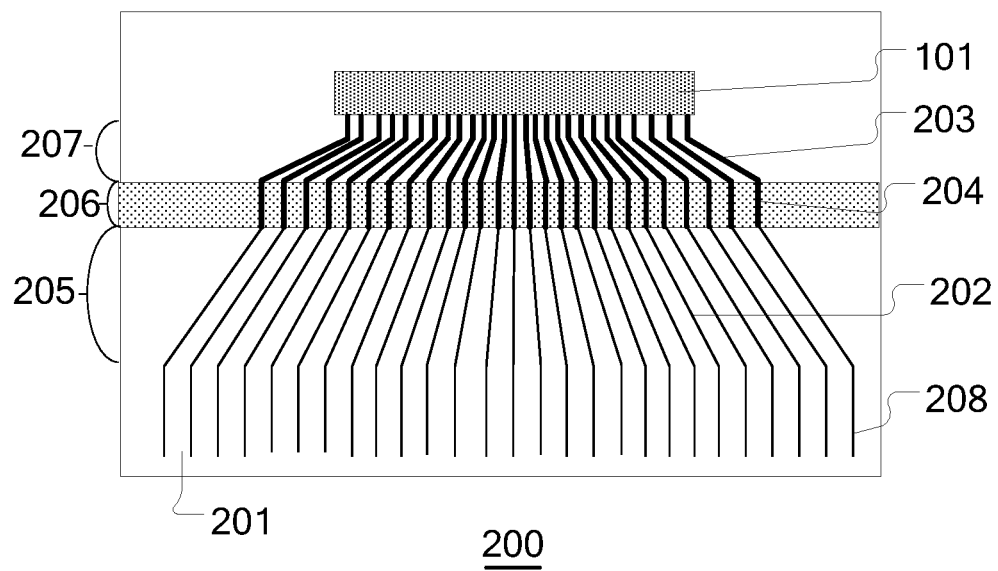
FIG. 2 is a schematic structural view of part of an array substrate provided by an embodiment of the present invention.

The embodiment of the present invention provides an array substrate. For instance, FIG. 2 is a schematic structural view of part of an array substrate provided by the embodiment of the present invention. The array substrate 200 comprises: a base substrate 201, and first leads 202, third leads 203 and second leads 204 for connecting the first leads 202 and the third leads 203 on the base substrate 201. The base substrate 201 includes a second region 206 corresponding to a sealing material, a sealed first region 205, and a third region 207 on a side of the second region 206 away from the first region 205. The first region 205 includes the first leads 202; the second region 206 includes the second leads 204; and the third region 207 includes the third leads 203. The area ratio of two adjacent third leads 203 is greater than the area ratio of corresponding two adjacent first leads 202.

For instance, in the plane parallel to the base substrate, if the occupied area of two adjacent leads is set to be a, and the area of a spaced region of the two adjacent leads is b, the area ratio is a/(a+b). Different array substrates have different requirements on the thickness and the width of the leads and also have different requirements on the occupied area of the leads.

For instance, as shown in FIG. 2, in the array substrate, the width of each of the third leads 203 is greater than the width of each of the first leads 202 corresponding to the third leads. For instance, the width of the third lead 203 may be 3-8 times of the width of the first lead 202. The width of the third leads 203 is widened to avoid poor electric signal transmission caused by the corrosion fracture of the third leads when the third leads 203 are corroded by solid impurities, oxygen, water and the like from the outside. Signal drivers may be mounted in a bonding region of the array substrate through anisotropic conductive adhesive (ACA), or electrically connected to the bonding region of the array substrate through a flexible printed circuit board (FPC).

Figure 3:
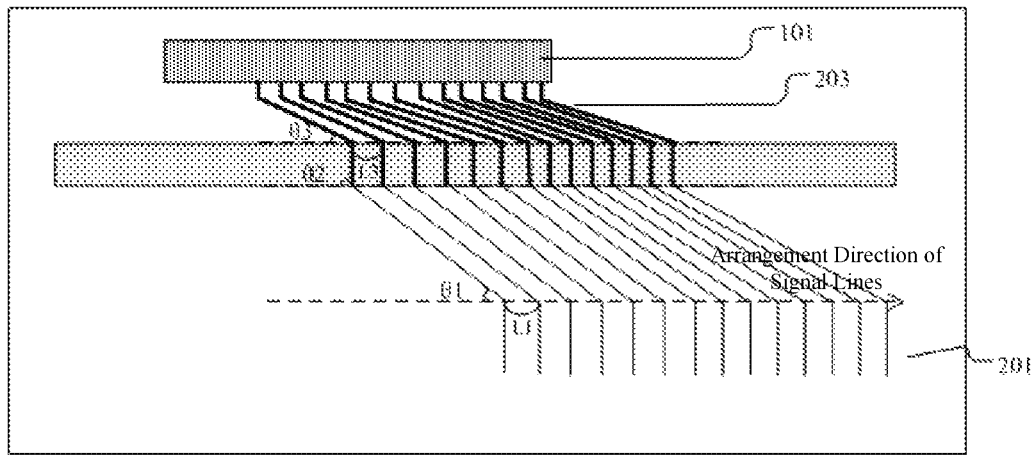
FIG. 3 is a schematic structural view of the part of the array substrate as shown in FIG. 2.

For instance, FIG. 3 is a schematic structural view of the part of the array substrate as shown in FIG. 2. For instance, as shown in FIG. 2, the array substrate further comprises signal lines 208 connected with the first leads 202. As shown in FIG. 3, an acute angle formed between the first leads 202 and the arrangement direction of the signal lines 208 is set to be a first angle $\theta 1$; an acute angle formed between the third leads 203 and the arrangement direction of the signal lines 208 is set to be a third angle $\theta 3$; and the third angle $\theta 3$ is greater than the first angle $\theta 1$ corresponding to the third angle. The signal lines 208 may be gate lines, data lines, touch driving lines, touch sensing lines, or the like.

As can be seen from FIGS. 2 and 3, in the direction parallel to the arrangement direction of the signal lines 208, the third angle $\theta 3$ formed between the third leads 203 and the arrangement direction of the signal lines 208 is larger from both sides to the central region. Similarly, in the direction parallel to the arrangement direction of the signal lines 208, the first angle $\theta 1$ formed between the first leads 202 and the arrangement direction of the signal lines 208 is larger from both sides to the central region. The third angle $\theta 3$ formed between the third leads 203 and the arrangement direction of the signal lines 208 is greater than the first angle $\theta 1$ formed between the first leads 202 corresponding to the third leads and the arrangement direction of the signal lines 208. In this way, the occupied area of the third region can be decreased. When the signal drivers are directly mounted on the array substrate, the occupied area of the signal drivers is decreased, or smaller signal drivers can be used; or, when the signal drivers are connected to the array substrate through the FPC, the bonding area of the FPC and the array substrate is decreased. In this way, the planar shape of the array substrate can be miniaturized.

For instance, as shown in FIGS. 2 and 3, in an example, the width of each second lead 204 may be greater than the width of each third lead 203 corresponding to the second lead. Compared with the first region 205, the second region 206 provided with a sealing material (e.g., sealant) will inevitably has more solid impurities, so the width of the each second lead 204 is needed to be increased.

For instance, an acute angle or a right angle formed between the second leads 204 and the arrangement direction of the signal lines 208 is set to be a second angle $\theta 2$, and the second angle $\theta 2$ is greater than the third angle $\theta 3$. That the second angle $\theta 2$ is set to be larger can further prevent or reduce the corrosion of the solid impurities on the second leads 204.

For instance, the second angle $\theta 2$ is 80-90 degrees. For instance, the second angle $\theta 2$ may be 80, 85, or 90 DEG. In this way, the spacing between two adjacent second leads 204 can be widened, and the corrosion of the solid impurities on the second leads 204 can be further prevented or reduced.

In the plane parallel to the base substrate, if the occupied area of two adjacent leads is set to be a, and the area of the spaced region of the two adjacent leads is b, the area ratio is $a/(a+b)$. When the occupied area a of the two adjacent leads is far less than the area b of the spaced region of the two adjacent leads, the area b of the spaced region of the two adjacent leads may be approximated as the area of a quadrangle formed by the connection of end points of the two adjacent leads. Different array substrates have different requirements on the area b of the spaced region of the two adjacent leads, and also have different requirements on the occupied area of the metal wires.

For instance, as shown in FIG. 3, the distance L1 between connecting points of two adjacent first leads 202 and the signal lines 208 corresponding to the two adjacent first leads is equal to the distance L2 of connecting points of two adjacent third leads 203 and second leads 204 corresponding to the two adjacent first leads. In this way, the spacing between the two adjacent first leads 202, or the two adjacent third leads 203 can be more conveniently designed.

Figure 4:
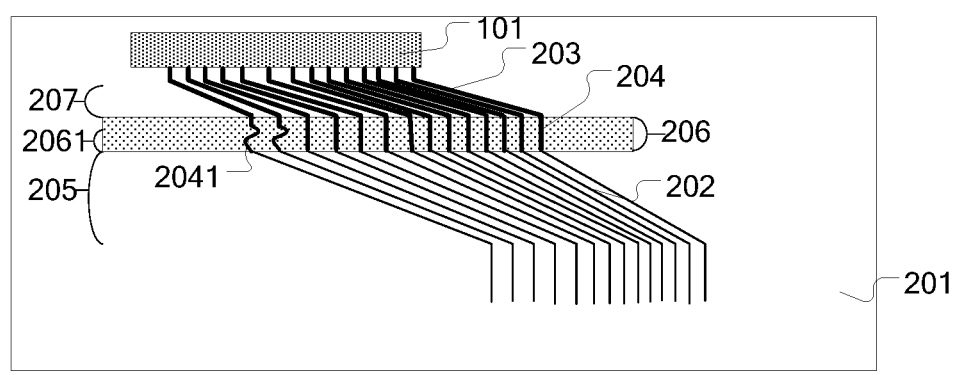
FIG. 4 is a schematic structural view of part of another array substrate provided by an embodiment of the present invention.

An embodiment of the present invention provides an array substrate. For instance, FIG. 4 is a schematic structural view of part of an array substrate provided by the embodiment of the present invention. As shown in FIG. 4, in the array substrate, the second region 206 includes a fourth sub-region 2061; the fourth sub-region 2061 is adjacent to the first region 205; and second sub-leads 2041 are disposed in the fourth sub-region 2061.

For instance, the width of partial second leads 204 of the second region 206 close to the third region 207 is designed to be greater than the width of the third leads 203 in the third region 207. In this way, the corrosion at interfaces between the sealing material and the third region can be further prevented.

For instance, as shown in FIG. 4, in the array substrate, the width of the second leads 204 and the second sub-leads 2041 is greater than the width of the first leads 202.

For instance, as shown in FIG. 4, in the array substrate, the second sub-lead 2041 at least has partial bending structure. As can be seen from FIG. 4, the sum of the length of the first lead 202 and corresponding second lead 204 and third lead 203 is greater when closer to the edge. In a case of the lead-out wire using the same material and the unchanged cross-sectional area, the resistance is in direct proportion to the length of the lead-out wire. In order to balance or reduce the resistance difference as much as possible, the lead-out wires close to the center are designed to be bending structures. The spacing between two adjacent second leads 204 in the second region 206 is large, so that the second leads 204 are more suitable to be designed into bending structures. The first leads 202 and the third leads 203 close to the center may also be designed into bending structures, so as to balance or reduce the resistance difference.

The inventors of the present invention also found that as the extent of corrosion of oxygen, water, solid impurities and the like on the lead-out wires on the outside and the inside of the sealant 102 is different, a combination of the following ways and any foregoing proposal may also be adopted to further reduce the poor electric signal transmission caused by the corrosion.

Figure 5:
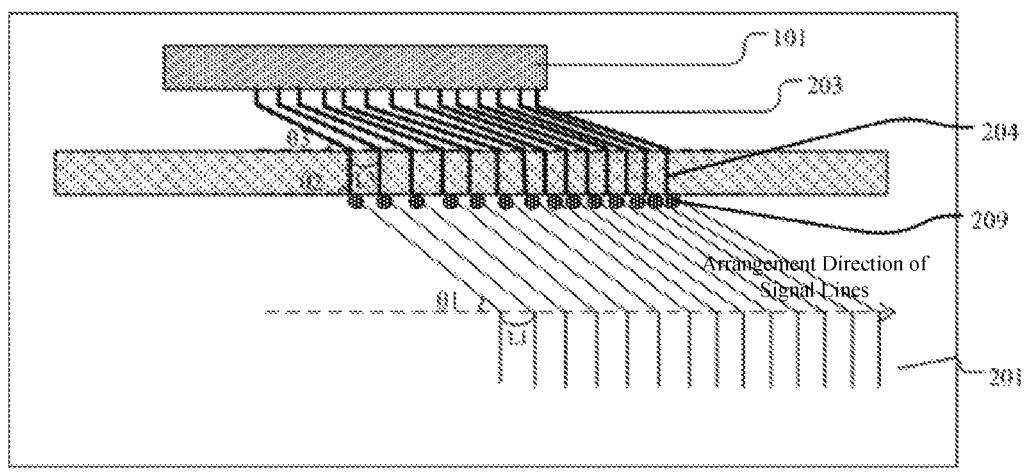
FIG. 5 is a schematic structural view of yet part of another array substrate provided by an embodiment of the present invention.

An embodiment of the present invention also provides another array substrate. For instance, FIG. 5 is a schematic structural view of part of yet another array substrate provided by the embodiment of the present invention. For instance, the first leads 202 and corresponding second leads 204 are not integrally formed on the same plane but formed on different planes. The first leads 202 and corresponding second leads 204 are connected with each other via through hole structures 209 disposed in the first region. Relative to non-connecting parts of the lead-out wires, the first leads 202 and the second leads 204 can be more easily corroded at the through hole structures 209 to cause poor electric signal transmission. The forming of the through hole structures in the first region can avoid the adverse effects of the sealing material(s) on the electric signal transmission at the through hole structures.

For instance, the first leads 202 are made from a metallic material, the main composition of which is one of the metal elements selected from a group consisting of Al, Cu, Mo and Ti, or made from an alloy formed by at least two metal elements selected from a group consisting of Al, Cu, Mo and Ti, for instance. For instance, the third leads 203 are made from a metallic material, the main composition of which is one of the metal elements selected from a group consisting of Al, Cu, Mo and Ti, or made from an alloy formed by at least two metal elements selected from a group consisting of Al, Cu, Mo and Ti. For instance, the thickness of the first leads 202 is less than the thickness of corresponding third leads 203. In this way, relative to the first leads 202, the corrosion resistance of the third leads 203 can be further enhanced. Optionally, the thickness of the second leads is less than or equal to the thickness of the third leads.

For instance, each of the third leads 203 includes multiple conductive layers, and the number of conductive layers of the third leads 203 is greater than the number of conductive layers of corresponding first leads 202. For instance, the third lead includes multiple metal layers formed by metals, such as Al, Cu, Mo and Ti, or the third lead includes multiple conductive layers formed by Al, Cu, Mo, Ti and indium tin oxide (ITO). The first leads may adopt a single-layer metal layer, or may include multiple conductive layers. The number of the conductive layers of the third leads 203 is greater than the number of the conductive layers of corresponding first leads 202. For instance, the number of the conductive layers of the second leads is less than or equal to the number of the conductive layers of the third leads.

For instance, the third leads 203 also include a corrosion-resistant layer. For instance, the corrosion-resistant layer is made from an anti-acid organic, or inorganic material, or an anti-alkaline organic, or inorganic material.

For instance, both the first leads 202 and the second leads 204 include a corrosion-resistant layer; and the corrosion resistance of the corrosion-resistant layer of the third leads 203 is stronger than the corrosion resistance of the corrosion-resistant layer of the first leads 202, and the second leads 204.

For instance, the third leads 203 at least include one metal layer of which the acid resistance and the alkaline resistance are stronger than those of the first leads 202. For instance, the third leads include Ti; the first leads only include Al; and Ti has stronger corrosion resistance than Al.

Embodiments of the present invention also provide a display device, which comprises any foregoing array substrate. For instance, the display device may be a display device, such as a liquid crystal display (LCD), e-paper, or an organic light-emitting diode (OLED) display, or any product or component with display function including the display device, such as a TV, a digital camera, a mobile phone, a watch, a tablet PC, a notebook computer, or a navigator.

The array substrate and the display device, provided by the embodiments of the present invention, have at least part or all of the following advantages: the defects, such as corrosion, can be avoided by designing the first angle formed between the lead-out wires and the arrangement direction of the signal lines in the first region, and the third angle formed between the lead-out wires and the arrangement direction of the signal lines in the third region, and the thickness of the lead-out wires in the first region, and the thickness of the lead-out wires in the third region; and the planar shape of a photoelectric device is miniaturized by setting corresponding angle relationship.

The following points should be noted:

(1) The accompanying drawings in the embodiments of the present invention only involve structures relevant to the embodiments of the present invention, and other structures may refer to the prior art.

(2) For clarity, in the accompanying drawings of the embodiments of the present invention, the thickness of layers or regions is enlarged or reduced. Unless otherwise specified, the accompanying drawings are not drawn according to actual scales. It should be understood that: when an element, such as a layer, a film, a region, or a substrate is referred to as being disposed "on" or "beneath" another element, the element may be "directly" disposed "on," or "beneath" another element, or an intermediate element may be provided between the elements.

(3) The embodiments of the present invention and the characteristics in the embodiments may be mutually combined without conflict.

The described above are only specific embodiments of the present invention, and the present invention is not limited thereto. The scope of the present invention is defined by the appended claims.

The present application claims priority to the Chinese patent application No. 201621035396.4 filed on Aug. 31, 2016, the disclosure of which is incorporated herein by reference as part of the application.

What is claimed is:

1. An array substrate, comprising:
a base substrate; and
first leads, third leads, and second leads connecting the first leads and the third leads on the base substrate, wherein
the base substrate includes a second region corresponding to a sealing material, a sealed first region, and a third region outside the second region away from the sealed first region;
the first region includes the first leads; the second region includes the second leads; and the third region includes the third leads; and
wherein each of the third leads has a width greater than that of each of the first leads corresponding to the third leads.

2. The array substrate according to claim 1, further comprising signal lines connected with the first leads, wherein an acute angle formed between the first leads and an arrangement direction of the signal lines is set to be a first angle; an acute angle formed between the third leads and the arrangement direction of the signal lines is set to be a third angle; and the third angle is greater than the first angle corresponding to the third angle.

3. The array substrate according to claim 1, wherein each of the second leads has a width greater than that of each of the third leads corresponding to the second leads.

4. The array substrate according to claim 2, wherein an acute angle or a right angle formed between the second leads and the arrangement direction of the signal lines is set to be a second angle; and the second angle is greater than the first angle.

5. The array substrate according to claim 4, wherein the second angle is 80-90 degrees.

6. The array substrate according to claim 1, wherein the second region comprises a fourth sub-region; the fourth sub-region being adjacent to the first region; and second sub-leads being disposed in the fourth sub-region.

7. The array substrate according to claim 6, wherein each of the second sub-leads has a width greater than or equal to that of each of the first leads.

8. The array substrate according to claim 7, wherein the second sub-lead at least comprises partial bending structure.

9. The array substrate according to claim 2, wherein a distance between connecting points of two adjacent first leads and the signal lines corresponding to the two adjacent first leads is equal to a distance between connecting points of two adjacent third leads and second leads corresponding to the two adjacent first leads.

10. The array substrate according to claim 1, further comprising through hole structures configured to connect the second leads and corresponding first leads, wherein the through hole structures are provided in the first region.

11. The array substrate according to claim 1, wherein each of the first leads has a thickness less than that of corresponding third lead.

12. The array substrate according to claim 1, wherein each of the third leads comprises multiple conductive layers; and a number of conductive layers of the third leads is greater than that of conductive layers of corresponding first leads.

13. The array substrate according to claim 1, wherein each of the third leads further comprises a corrosion-resistant layer.

14. The array substrate according to claim 13, wherein each of the first leads and the second leads comprise a corrosion-resistant layer; and the corrosion resistance of the corrosion-resistant layer of each of the third leads is stronger than that of the corrosion-resistant layer of each of the first leads and the second leads.

15. A display device, comprising an array substrate, wherein
the array substrate comprises,
a base substrate; and
first leads, third leads, and second leads connecting the first leads and the third leads on the base substrate, wherein
the base substrate includes a second region corresponding to a sealing material, a sealed first region, and a third region outside of the second region away from the sealed first region;
the first region includes the first leads; the second region includes the second leads; and the third region includes the third leads; and
wherein each of the third leads has a width greater than that of each of the first leads corresponding to the third leads.

16. The display device according to claim 15, further comprising signal lines connected with the first leads, wherein an acute angle formed between the first leads and an arrangement direction of the signal lines is set to be a first angle; an acute angle formed between the third leads and the arrangement direction of the signal lines is set to be a third angle; and the third angle is greater than the first angle corresponding to the third angle.

17. The display device according to claim 15, wherein each of the second leads has a width greater than that of each of the third leads corresponding to the second leads.

18. The display device according to claim 16, wherein an acute angle or a right angle formed between the second leads and the arrangement direction of the signal lines is set to be a second angle; and the second angle is greater than the first angle.

19. An array substrate, comprising:
a base substrate; and
first leads, third leads, and second leads connecting the first leads and the third leads on the base substrate, wherein
the base substrate includes a second region corresponding to a sealing material, a sealed first region, and a third region outside the second region away from the sealed first region;
the first region includes the first leads; the second region includes the second leads; and the third region includes the third leads; and
an area ratio of at least part of two adjacent third leads is greater than that of corresponding two adjacent first leads, wherein the area ratio refers to a/(a+b), where a is an occupied area of two adjacent leads, b is an area of a spaced region between the two adjacent leads.

* * * * *